United States Patent
Schmidt

(10) Patent No.: US 11,280,833 B2
(45) Date of Patent: Mar. 22, 2022

(54) TESTING DEVICE AND TESTING METHOD FOR TESTING A DEVICE UNDER TEST

(71) Applicant: Rohde & Schwarz GmbH & Co. KG, Munich (DE)

(72) Inventor: Stefan Schmidt, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 91 days.

(21) Appl. No.: 16/240,180

(22) Filed: Jan. 4, 2019

(65) Prior Publication Data

US 2020/0217891 A1 Jul. 9, 2020

(51) Int. Cl.
*G01R 31/3183* (2006.01)
*G01R 31/317* (2006.01)
(Continued)

(52) U.S. Cl.
CPC ........ *G01R 31/318321* (2013.01); *G01R 31/31709* (2013.01); *G01R 31/31727* (2013.01); *H03M 1/0607* (2013.01); *H04B 17/0085* (2013.01); *G01R 31/2841* (2013.01); *G01R 31/3167* (2013.01); *G06F 1/0328* (2013.01); *G10L 19/005* (2013.01); *G10L 19/02* (2013.01); *G10L 19/0212* (2013.01); *G10L 19/26* (2013.01); *G10L 21/0208* (2013.01); *H03M 1/108* (2013.01); *H04L 27/16* (2013.01);
(Continued)

(58) Field of Classification Search
CPC ....... G10L 19/02; G10L 19/26; G10L 19/005; G10L 19/0212; G10L 21/0208; H04L 27/2032; H04L 27/362; H04L 2027/0053; H04L 2027/0069; H04L 27/16; G06F 1/0328; G01R 31/2841; G01R 31/3167; G01R 31/31727; G01R 31/31709; G01R 31/31832; H03M 1/108; H03M 1/0607; H04B 17/0085

See application file for complete search history.

(56) References Cited

U.S. PATENT DOCUMENTS 5,416,512 A * 5/1995 Kim ................. G01N 21/956
348/126
5,532,749 A * 7/1996 Hong ................ H04N 7/0102
348/441

(Continued)

OTHER PUBLICATIONS

ETSI TS 136 521-1 v 15.2.0 (Oct. 2018), "LTE; Evolved Universal Terrestrial Radio Access (E-UTRA); User Equipment (UE) conformance specification; Radio transmission and reception; Part 1: Conformance testing (3GPP TS 36.521-1 version 15.2.0. Release 15)", 6 pages.

(Continued)

*Primary Examiner* — April Y Blair
*Assistant Examiner* — Sazzad Hossain
(74) *Attorney, Agent, or Firm* — Ditthavong, Steiner & Mlotkowski

(57) ABSTRACT

A testing device and a method for testing a device under test are provided. The testing device comprises at least two signal generators, at least two numerically controlled oscillators, at least two white gaussian noise generators, at least two digital filters, each of which comprising a respective transfer function $H_i$, at least two adders, at least two digital-to-analog converters, and an analog processor.

19 Claims, 11 Drawing Sheets

(51) Int. Cl.
  *H04B 17/00* (2015.01)
  *H03M 1/06* (2006.01)
  *G10L 19/02* (2013.01)
  *H04L 27/20* (2006.01)
  *G10L 19/005* (2013.01)
  *H04L 27/00* (2006.01)
  *G06F 1/03* (2006.01)
  *G01R 31/28* (2006.01)
  *G10L 21/0208* (2013.01)
  *H03M 1/10* (2006.01)
  *G10L 19/26* (2013.01)
  *H04L 27/36* (2006.01)
  *H04L 27/16* (2006.01)
  *G01R 31/3167* (2006.01)

(52) U.S. Cl.
  CPC ........ *H04L 27/2032* (2013.01); *H04L 27/362* (2013.01); *H04L 2027/0053* (2013.01); *H04L 2027/0069* (2013.01)

(56) References Cited

U.S. PATENT DOCUMENTS

| | | | | |
|---|---|---|---|---|
| 7,454,330 | B1* | 11/2008 | Nishiguchi | G10L 19/02 704/224 |
| 2001/0016863 | A1* | 8/2001 | Uchino | G06F 1/0328 708/271 |
| 2008/0042753 | A1* | 2/2008 | Bauernfeind | H03L 7/187 331/1 A |
| 2011/0018626 | A1* | 1/2011 | Kojima | H04L 27/38 329/306 |
| 2012/0264377 | A1* | 10/2012 | Seelenfreund | H04W 24/06 455/67.11 |
| 2015/0061610 | A1* | 3/2015 | Hu | H02M 1/00 323/234 |

OTHER PUBLICATIONS

Butter, "On the Thoery of Filter Amplifiers", published in the wireless engineer, Oct. 1930, 7 pages.

* cited by examiner

TESTING DEVICE AND TESTING METHOD FOR TESTING A DEVICE UNDER TEST

TECHNICAL FIELD

The invention relates to a testing device and a testing method for testing a device under test, especially a device under test providing wireless communication capabilities.

BACKGROUND ART

Generally, in times of an increasing number of applications providing wireless communication capabilities, there is a growing need of a testing device and a corresponding testing method for testing a device under test comprising such an application in order to verify correct functioning of said applications in a highly accurate and efficient manner.

In accordance with the standard 3GPP TS 36.521-1 V15.2.0 (2018-0), chapters 8.2.1.3.1-A.2.3 and 8.2.1.3.1-A.2.4, a well-defined signal-to-noise ratio (SNR) has to be achieved within an aggregated bandwidth. With respect to said well-defined SNR, an artificial white gaussian noise signal has to be generated that fulfills a tight ripple requirement over said aggregated bandwidth. In this context, there is neither a testing device nor a testing method available for providing a well-defined SNR within an aggregated bandwidth.

Accordingly, there is a need to provide a testing device and a corresponding testing method for testing a device under test, each of which ensures both a high accuracy and a high efficiency with special respect to achieving a well-defined SNR within an aggregated bandwidth.

SUMMARY OF THE INVENTION

According to a first aspect of the invention, a testing device for testing a device under test is provided. The testing device comprises at least two signal generators, at least two numerically controlled oscillators, at least two white gaussian noise generators, at least two digital filters, each of which comprising a respective transfer function $H_i$, at least two adders, at least two digital-to-analog converters, and an analog processor. In this context, each of the at least two signal generators is configured to output a respective digital baseband signal $s_i$, whereas each of the at least two white gaussian noise generators is configured to output a respective white gaussian noise signal $WGN_i$. Furthermore, each of the at least two digital filters is configured to filter the respective white gaussian noise signal $WGN_i$ of the corresponding white gaussian noise generator. In addition to this, each of the at least two numerically controlled oscillators is configured to digitally shift the respective digital baseband signal $s_i$ of the corresponding signal generator or the respective filtered gaussian noise signal $WGN_i*H_i$ of the corresponding digital filter by a respective frequency offset $\Delta f_i$.

According to a first preferred implementation form of the first aspect of the invention, each of the at least two adders is configured to add the respective digital filter output $WGN_i*H_i$ of the corresponding digital filter or the respective frequency-shifted digital filter output $(WGN_i*H_i)$, of the corresponding numerically controlled oscillator to the respective frequency-shifted digital baseband signal $s_i$, of the corresponding numerically controlled oscillator or to the respective digital baseband signal $s_i$ of the corresponding signal generator. Further additionally, each of the at least two digital-to-analog converters is configured to convert the respective adder output $s_i+WGN_i*H_i$ or $s_i+(WGN_i*H_i)$ of the corresponding adder from digital to analog. Moreover, in the case that the respective digital baseband signal $s_i$ of the corresponding signal generator has digitally been shifted in frequency, the analog processor is preferably configured to compensate the respective frequency offset $\Delta f_i$ by shifting the respective analog output of the corresponding digital-to-analog converter to a respective difference frequency $f_{c,i} - \Delta f_i$ of the respective desired carrier frequency $\Delta f_{c,i}$ and the respective frequency offset $\Delta f_i$ in the analog domain. In addition to this, the analog processor is further configured to add the corresponding resulting frequency compensated analog signals.

Advantageously, a well-defined SNR can be achieved within an aggregated bandwidth in a highly accurate and efficient manner.

According to a second preferred implementation form of the first aspect of the invention, at least one frequency offset $\Delta f_i$ is not equal to zero. Advantageously, both accuracy and efficiency can further be increased.

According to a further preferred implementation form of the first aspect of the invention, the white gaussian noise signals $WGN_i$ are pairwise statistically independent. Advantageously, not only accuracy but also efficiency can further be increased.

According to a further preferred implementation form of the first aspect of the invention, the digital filters are designed such that the overall noise frequency response after addition with the aid of the analog processor fulfills a minimum ripple requirement outside well-defined guard bands. Advantageously, for instance, accuracy can further be increased.

According to a further preferred implementation form of the first aspect of the invention, at least two of the filtered white gaussian noise signals $WGN_i*H_i$ or $(WGN_i*H_i)$, overlap in the frequency domain after addition with the aid of the analog processor. Advantageously, for example, an increased efficiency can be ensured.

According to a further preferred implementation form of the first aspect of the invention, at least two of the filtered white gaussian noise signals $WGN_i*H_i$ or $(WGN_i*H_i)$, overlap in the frequency domain such that the at least two white gaussian noise signals fulfill a minimum ripple requirement outside well-defined guard bands. Advantageously, for instance, errors can further be decreased.

According to a further preferred implementation form of the first aspect of the invention, the minimum ripple requirement is fulfilled by complementary edges of the at least two digital filters. Advantageously, complexity can be reduced, thereby increasing efficiency.

According to a further preferred implementation form of the first aspect of the invention, the digital filters are designed such that the following criteria are, preferably approximately, fulfilled:

$$|H_i(f_{p,i}+\Delta_i)|^2 + |H_i(f_{p,i}-\Delta_i)|^2 = 1 \text{ and}$$

$$|H_i(-f_{p,i}+\Delta_i)|^2 + |H_i(-f_{p,i}-\Delta_i)|^2 = 1,$$

wherein $f_{p,i}$ denotes the frequency at the respective 3-dB point, wherein $\equiv \Delta_i \equiv \leq \min(f_s/2 - f_{p,i}, f_{p,i})$, wherein $f_s$ denotes the sampling frequency. Advantageously, for instance, accuracy can be increased.

According to a further preferred implementation form of the first aspect of the invention, the digital filters are designed such that the following criteria are fulfilled:

$$1 - e_i \leq |H_i(f_{p,i}+\Delta_i)|^2 + |H_i(f_{p,i}-\Delta_i)|^2 \leq 1 + e_i$$

and $$1 - e_i \leq |H_i(-f_{p,i}+\Delta_i)|^2 + |H_i(-f_{p,i}-\Delta_i)|^2 \leq 1 + e_i,$$

wherein $e_i$ denotes a respective allowed ripple,
wherein $f_{p,i}$ denotes the frequency at the respective 3-dB point, wherein $|\Delta_i| \leq \min(f_s/2-f_{p,i}, f_{p,i})$, wherein $f_s$ denotes the sampling frequency. Advantageously, for example, accuracy can further be increased.

According to a further preferred implementation form of the first aspect of the invention, at least one of the at least two digital filters comprises or is a Butterworth filter. Advantageously, both accuracy and efficiency can further be increased.

According to a further preferred implementation form of the first aspect of the invention, at least one of the at least two digital filters comprises or is an elliptic filter. Advantageously, not only accuracy but also efficiency can further be increased.

According to a further preferred implementation form of the first aspect of the invention, at least one transfer function $H_i$ is of trapezoidal shape. Advantageously, for instance, complexity can further be reduced, thereby especially increasing efficiency.

According to a second aspect of the invention, a testing method for testing a device under test is provided. The testing method comprises the steps of outputting at least two digital baseband signals $s_i$ with the aid of at least two respective signal generators, outputting at least two white gaussian noise signals $WGN_i$ with the aid of at least two respective white gaussian noise generators, filtering each of the respective white gaussian noise signals $WGN_i$ of the corresponding white gaussian noise generator with the aid of at least two respective digital filters, each of which comprising a respective transfer function $H_i$, and digitally shifting at least one of the respective digital baseband signals $s_i$ of the corresponding signal generator or at least one of the respective filtered white gaussian noise signals $WGN_i*H_i$ of the corresponding digital filter by a respective frequency offset $\Delta f_i$ with the aid of at least two respective numerically controlled oscillators.

According to a first preferred implementation form of the second aspect of the invention, the testing method further comprises the step of adding at least one of the respective digital filter outputs $WGN_i*H_i$ of the corresponding digital filter or at least one of the respective frequency-shifted digital filter outputs $(WGN_i*H_i)$, of the corresponding numerically controlled oscillator to the respective frequency-shifted digital baseband signal $s_i$, of the corresponding numerical controlled oscillator or to the respective digital baseband signal $s_i$ of the corresponding signal generator with the aid of at least two respective adders, whereby converting each of the respective adder outputs $s_i+WGN_i*H_i$ or $s_i+(WGN_i*H_i)$, of the corresponding adder from digital to analog with the aid of at least two respective digital-to-analog converters, whereby in the case that the respective digital baseband signal $s_i$ of the corresponding signal generator has digitally been shifted in frequency, compensating each of the respective frequency offsets $\Delta f_i$ by shifting the respective analog output of the corresponding digital-to-analog converter to a respective difference frequency $f_{c,i}-\Delta f_i$ of the respective desired carrier frequency $f_{c,i}$ and the respective frequency offset $\Delta f_i$ in the analog domain with the aid of an analog processor, and whereby adding the corresponding resulting frequency compensated analog signals with the aid of the analog processor.

Advantageously, a well-defined SNR can be achieved within an aggregated bandwidth in a highly accurate and efficient manner.

According to a second preferred implementation form of the second aspect of the invention, at least one frequency offset $\Delta f_i$ is not equal to zero. Advantageously, both accuracy and efficiency can further be increased.

According to a further preferred implementation form of the second aspect of the invention, the white gaussian noise signals $WGN_i$ are pairwise statistically independent. Advantageously, not only accuracy but also efficiency can further be increased.

According to a further preferred implementation form of the second aspect of the invention, the testing method further comprises the step of designing the digital filters such that the overall noise frequency response after addition with the aid of the analog processor fulfills a minimum ripple requirement outside well-defined guard bands. Advantageously, for instance, accuracy can further be increased.

According to a further preferred implementation form of the second aspect of the invention, at least two of the filtered white gaussian noise signals $WGN_i*H_i$ or $(WGN_i*H_i)$, overlap in the frequency domain after addition with the aid of the analog processor. In addition to this or as an alternative, at least two of the filtered white gaussian noise signals $WGN_i*H_i$ or $(WGN_i*H_i)$, overlap in the frequency domain such that the at least two white gaussian noise signals fulfill a minimum ripple requirement outside well-defined guard bands.

Advantageously, for example, an increased efficiency can be ensured. Further advantageously, for instance, errors can further be decreased.

According to a further preferred implementation form of the second aspect of the invention, the minimum ripple requirement is fulfilled by complementary edges of the at least two digital filters. Advantageously, complexity can be reduced, thereby increasing efficiency.

According to a further preferred implementation form of the second aspect of the invention, the testing method further comprises the step of designing the digital filters such that the following criteria are, preferably at least approximately, fulfilled:

$$|H_i(f_{p,i}+\Delta_i)|^2+|H_i(f_{p,i}-\Delta_i)|^2=1 \text{ and}$$

$$|H_i(-f_{p,i}+\Delta_i)|^2+|H_i(-f_{p,i}-\Delta_i)|^2=1,$$

wherein $f_{p,i}$ denotes the frequency at the respective 3-dB point, wherein $|\Delta_i| \leq \min(f_s/2-f_{p,i}, f_{p,i})$, wherein $f_s$ denotes the sampling frequency. Advantageously, for instance, accuracy can be increased.

In addition to this or as an alternative, the testing method further comprises the step of designing the digital filters such that the following criteria are fulfilled:

$$1-e_i \leq |H_i(f_{p,i}+\Delta_i)|^2+|H_i(f_{p,i}-\Delta_i)|^2 \leq 1+e_i$$

and $$1-e_i \leq |H_i(-f_{p,i}+\Delta_i)|^2+|H_i(-f_{p,i}-\Delta_i)|^2 \leq 1+e_i,$$

wherein denotes $e_i$ a respective allowed ripple, wherein $f_{p,i}$ denotes the frequency at the respective 3-dB point, wherein $|\Delta_i| \leq \min(fs/2-f_{p,i}, f_{p,i})$, wherein $f_s$ denotes the sampling frequency. Advantageously, for example, accuracy can further be increased.

According to a further preferred implementation form of the second aspect of the invention, at least one of the at least two digital filters comprises or is a Butterworth filter. In addition to this or as an alternative, at least one of the at least two digital filters comprises or is an elliptic filter. Further additionally or further alternatively, at least one transfer function $H_i$ is of trapezoidal shape. Advantageously, both accuracy and efficiency can further be increased. Further advantageously, for instance, complexity can further be reduced, thereby especially increasing efficiency.

BRIEF DESCRIPTION OF THE DRAWINGS

Exemplary embodiments of the invention are now further explained with respect to the drawings by way of example only, and not for limitation. In the drawings.

DETAILED DESCRIPTION OF THE PREFERRED EMBODIMENTS

Figure 1:
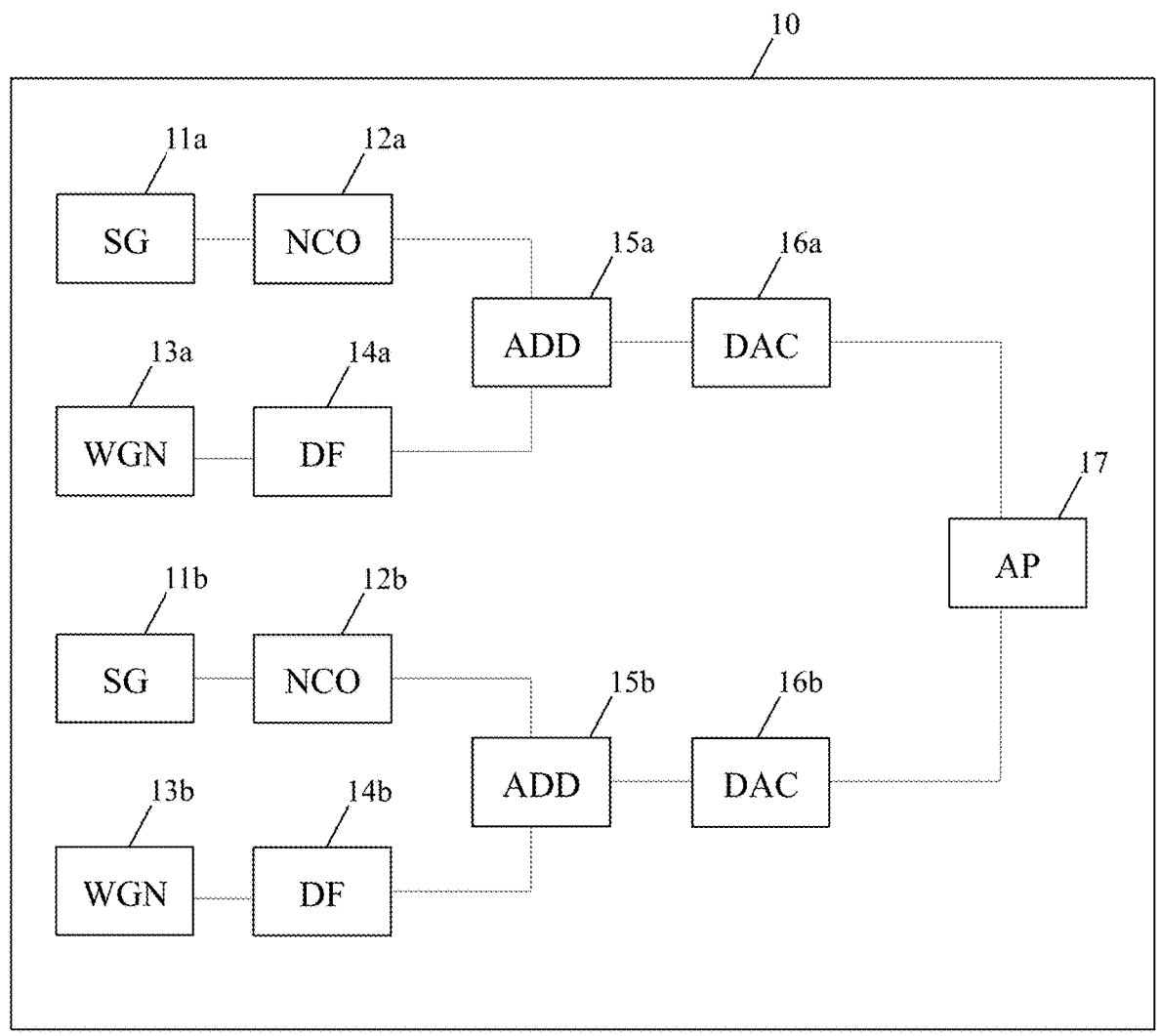
FIG. 1 shows an exemplary embodiment of the first aspect of the invention.

Firstly, FIG. 1 illustrates an exemplary embodiment of the inventive testing device 10 for testing a device under test. Said system 10 comprises two signal generators 11a, 11b, two numerically controlled oscillators 12a, 12b, two white gaussian noise generators 13a, 13b, two digital filters 14a, 14b, each of which comprising a respective transfer function $H_i$ (with i=1; 2), two adders 15a, 15b, two digital-to-analog converters 16a, 16b, and an analog processor 17.

In this context, each of the two signal generators 11a, 11b outputs a respective digital baseband signal $s_i$ (with i=1; 2), whereas each of the two numerically controlled oscillators 12a, 12b digitally shifts the respective digital baseband signal $s_i$ of the corresponding signal generator by a respective frequency offset $\Delta f_i$ (with i=1; 2), wherein each of the two white gaussian noise generators 13a, 13b outputs a respective white gaussian noise signal $WGN_i$ (with i=1; 2). In addition to this, each of the two digital filters 14a, 14b filters the respective white gaussian noise signal $WGN_i$ of the corresponding white gaussian noise generator.

Furthermore, each of the two adders 15a, 15b adds the respective digital filter output $WGN_i * H_i$ of the corresponding digital filter to the respective frequency-shifted digital baseband signal $s_i$ of the corresponding numerically controlled oscillator. Further additionally, each of the two digital-to-analog converters 16a, 16b converts the respective adder output $s_i + WGN_i * H_i$ of the corresponding adder from digital to analog. Moreover, the analog processor 17 compensates the respective frequency offset $\Delta f_i$ by shifting the respective analog output of the corresponding digital-to-analog converter to a respective difference frequency $f_{c,i} - \Delta f_i$ of the respective desired carrier frequency $\Delta f_{c,i}$ (with i=1; 2) and the respective frequency offset $\Delta f_i$ in the analog domain. In addition to this, the analog processor 17 adds the corresponding resulting frequency compensated analog signals.

It is noted that it might be particularly advantageous if at least one frequency offset $\Delta f_i$ is not equal to zero. Further advantageously, the white gaussian noise signals $WGN_i$ may pairwise be statistically independent.

It is further noted that the digital filters 14a, 14b may preferably be designed such that the overall noise frequency response after addition with the aid of the analog processor 17 fulfills a minimum ripple requirement outside well-defined guard bands.

Moreover, at least two of the filtered white gaussian noise signals $WGN_i * H_i$ may preferably overlap in the frequency domain after addition with the aid of the analog processor 17.

In addition to this or as an alternative, at least two of the filtered white gaussian noise signals $WGN_i * H_i$ may especially overlap in the frequency domain such that the at least two white gaussian noise signals fulfill a minimum ripple requirement outside well-defined guard bands.

Furthermore, the minimum ripple requirement may preferably be fulfilled by complementary edges of the two digital filters 14a, 14b.

It might be particularly advantageous if the digital filters 14a, 14b are designed such that the following criteria are, preferably approximately, fulfilled:

$$|H_i(f_{p,i}+\Delta_i)|^2 + |H_i(f_{p,i}-\Delta_i)|^2 = 1 \text{ and} \quad (1a)$$

$$|H_i(-f_{p,i}+\Delta_i)|^2 + |H_i(-f_{p,i}-\Delta_i)|^2 = 1, \quad (1b)$$

wherein $f_{p,i}$ denotes the frequency at the respective 3-dB point, wherein $|\Delta_i| \leq \min(f_s/2 - f_{p,i}, f_{p,i})$, wherein $f_s$ denotes the sampling frequency.

Additionally or alternatively, the digital filters 14a, 14b may preferably be designed such that the following criteria are fulfilled:

$$1 - e_i \leq |H_i(f_{p,i}+\Delta_i)|^2 + |H_i(f_{p,i}-\Delta_i)|^2 \leq 1 + e_i \text{ and} \quad (2a)$$

$$1 - e_i \leq |H_i(-f_{p,i}+\Delta_i)|^2 + |H_i(-f_{p,i}-\Delta_i)|^2 \leq 1 + e_i, \quad (2b)$$

wherein denotes $e_i$ a respective allowed ripple, wherein $f_{p,i}$ denotes the frequency at the respective 3-dB point, wherein $|\Delta_i| \leq \min(f_s/2 - f_{p,i}, f_{p,i})$, wherein $f_s$ denotes the sampling frequency.

It is further noted that it might be particularly advantageous if at least one of the two digital filters 14a, 14b comprises or is a Butterworth filter.

In addition to this or as an alternative, at least one of the two digital filters 14a, 14b may preferably comprises or may preferably be an elliptic filter.

Further additionally or further alternatively, at least one transfer function $H_i$ may preferably be of trapezoidal shape.

Figure 2:
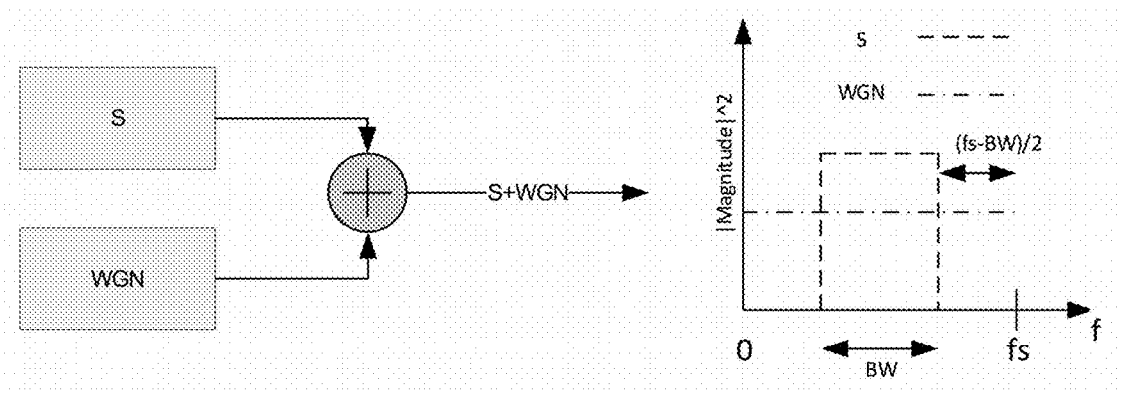
FIG. 2 shows an exemplary addition of a signal and white gaussian noise.

Moreover, a block diagram that shows the addition of a signal S and white gaussian noise WGN in the digital baseband is given in FIG. 2. In this context, BW denotes the bandwidth of the signal S, whereas fs denotes the sampling frequency.

Figure 3:
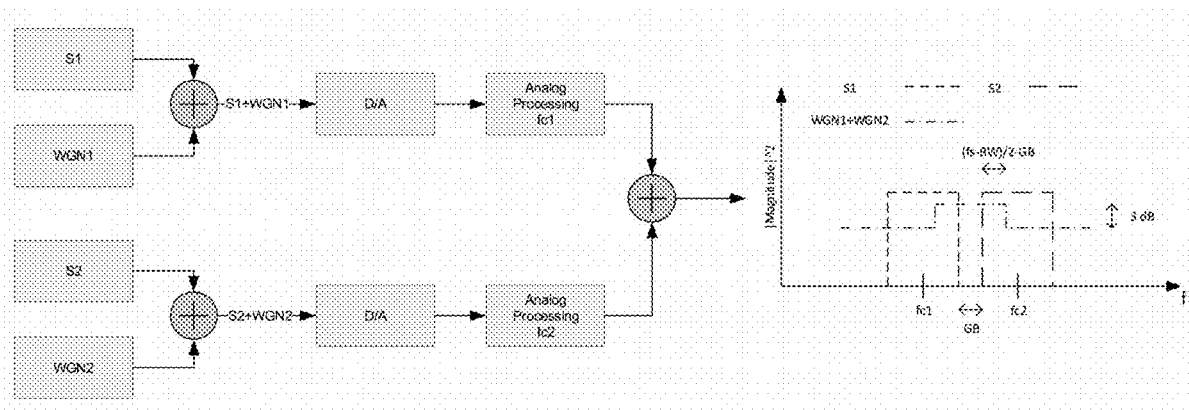
FIG. 3 shows an exemplary addition of two signals with corresponding white gaussian noise and further processing thereof.

By analogy therewith, FIG. 3 illustrates an addition of S1+WGN1 and S2+WGN2, where both S1+WGN1 and S2+WGN2 are generated according to FIG. 2. In addition to this, it is noted that WGN1 and WGN2 are statistically independent. In this context, fc1 and fc2 denote the respective radio frequency centre frequencies of S1 and S2. Furthermore, S1 and S2 are exemplarily separated by a guard band GB.

A WGN ripple of 3 dB can be observed that overlaps with the wanted signals S1 and S2 by a bandwidth portion according to the following expression:

$$\frac{fs - BW}{2} - GB. \tag{3}$$

The order of magnitude of the WGN ripple requirement in the wanted signal bands may approximately be 0.05 dB.

Since the following expression (4) may preferably apply, the WGN ripple requirement within the wanted signal bands is violated:

$$\frac{fs - BW}{2} > GB. \tag{4}$$

It is noted that this ripple violation can be avoided by applying appropriate lowpass filters H(f) to the WGN signals.

Figure 4:
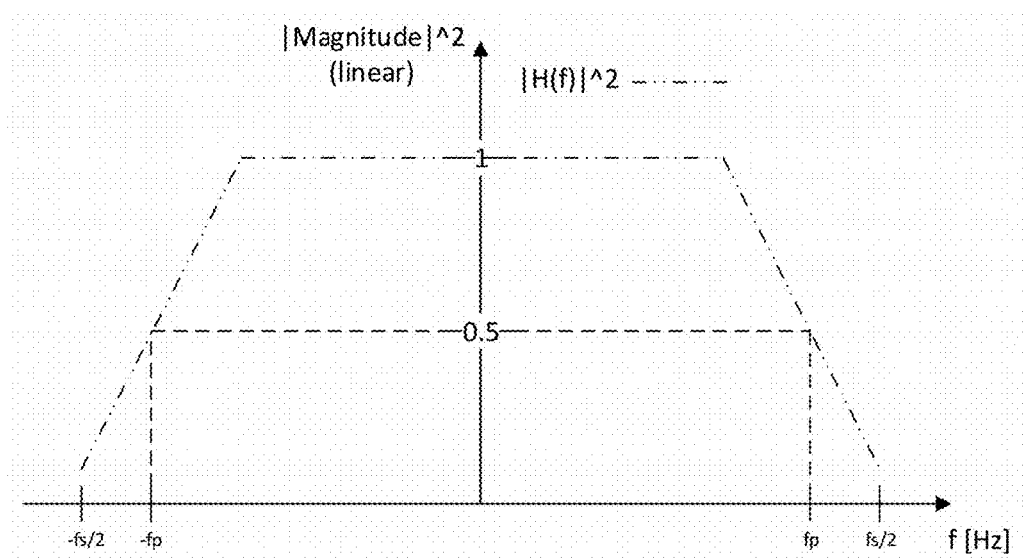
FIG. 4 shows an exemplary lowpass filter transfer function.

In this context, without loss of generality, it is assumed that $|H(f)|^2$ may especially be 1 in the passband. If, $|H(\pm fp)|^2=0.5$, then an ideal filter magnitude frequency response should fulfill the criterion $|H(fp+\Delta)|^2 + |H(fp-\Delta)|^2=1$ and $|H(-fp+\Delta)|^2+|H(-fp-\Delta)|^2=1$ for $|\Delta_i| \leq \min(fs/2-f_{p,i}, f_{p,i})$. Such a filter is exemplarily shown in FIG. 4. It is noted that fs denotes the sampling frequency, whereas fp denotes the respective frequency at the 3-dB point.

If such a filter is applied to WGN1 and WGN2, it can be made sure that WGN1*H and WGN2*H add up without ripple in the analog domain. In order to achieve this, it should preferably be ensured that frequency shifts $\Delta f_1$ and $\Delta f2$ are applied to S1 and S2 in the digital domain. Those shifts should advantageously be compensated by frequency shifts $-\Delta f_1$ and $-\Delta f2$ in the analog domain. In this context, $\Delta f_1$ and $\Delta f2$ should especially fulfill the following equation:

$$(fc2+\Delta f2) - (fc1+\Delta f1) = 2fp. \tag{5}$$

Figure 5:
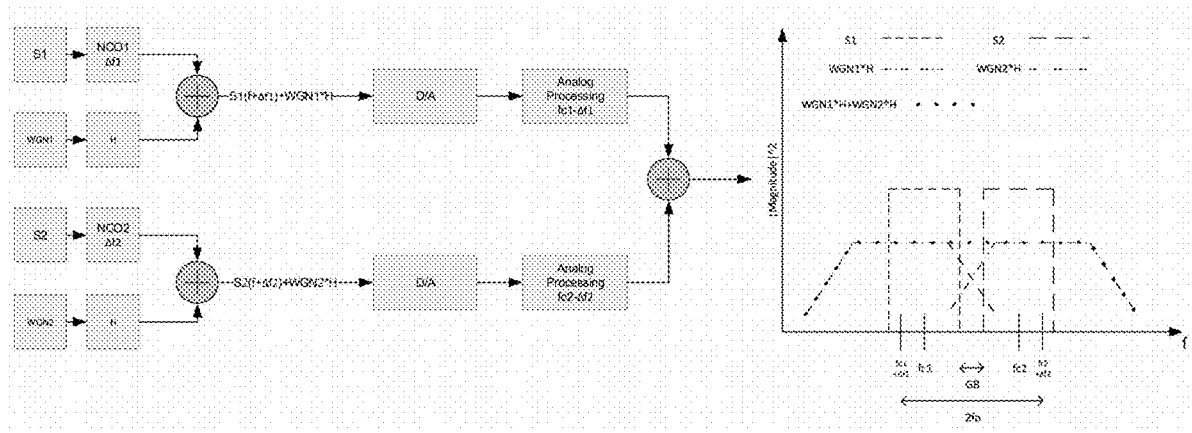
FIG. 5 shows an exemplary signal processing arrangement according to FIG. 3 with frequency shifting.

It is noted that without loss of generality, it has been assumed that $f_{c2} > \Delta f_{c1}$. In this context, also compare FIG. 5.

Figure 6:
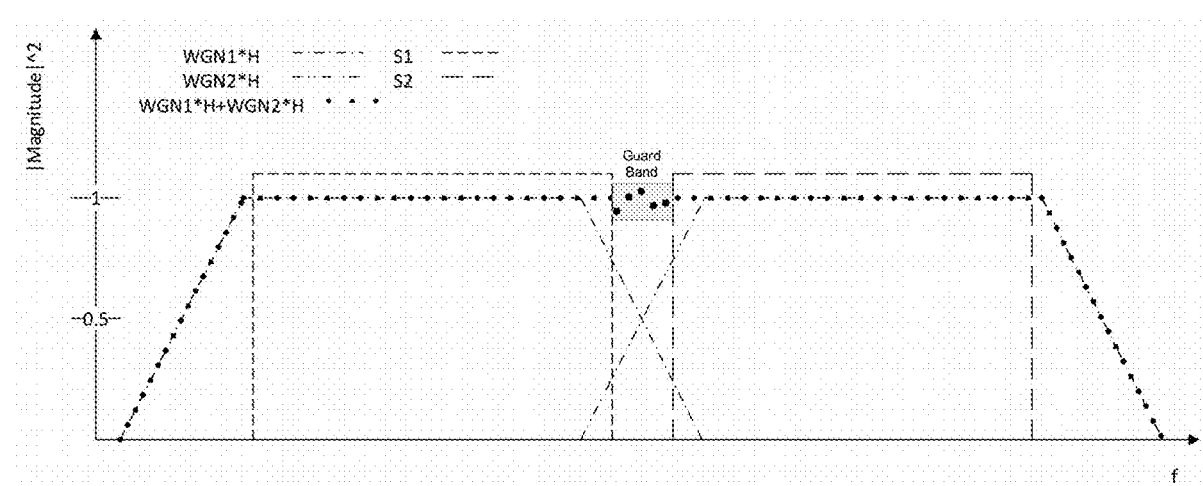
FIG. 6 shows an exemplary transfer function with respect to two signals with corresponding white gaussian noise.

Now, with respect to FIG. 6, S1+WGN1*H and S2+WGN2*H are exemplarily shown. In this context, it is noted that without loss of generality, it is assumed that $\Delta f1 < 0$ and $\Delta f2 > 0$, wherein $|H(fp+\Delta)|^2+|H(fp-\Delta)|^2=1$ and likewise $H(-fp+\Delta)|^2+|H(-fp-\Delta)|^2=1$ for $|\Delta| \leq \min(fs/2-fp, fp)$ may not be fulfilled exactly.

It is further noted that a lowpass filter may especially not fulfill the frequency response criterion $H(fp+\Delta)|_2+|H(fp-\Delta)|^2=1$ and $1H(-fp+\Delta)|^2+|H(-fp-\Delta)|^2=1$ for $|\Delta| \leq \min (fs/2-fp, fp)$ exactly.

However, this should not be a problem because the WGN is allowed to have a certain ripple, i.e. it is sufficient to have $|H(fp+\Delta)|^2+|H(fp-\Delta)|^2 \approx 1$ and $|H(-fp+\Delta)|^2+|H(-fp-\Delta)|^2 \approx 1$ for $|\Delta| \leq \min(fs/2-fp, fp)$ (or likewise $1-e \leq |H(fp+\Delta)|^2+|H(fp-\Delta)|^2 \leq 1+e$ and $1-e \leq |H(-fp+\Delta)|^2+|H(-fp-\Delta)|^2 \leq 1+e$ for $|\Delta| \leq \min(fs/2-fp, fp)$ wherein e denotes the allowed ripple).

Moreover, it is noted that there may preferably exist a guard band. Since there may be no requirement for the frequency response in the guard band, the frequency response in the guard band may be arbitrary. Taking this into account, the required lowpass filters can advantageously be designed with low effort (low filter order).

In an exemplary implementation, the lowpass filter could be realized digitally as a cascade of two second order Butterworth filters. The frequency response of a second order Butterworth filter in the analog domain is given according to the following formula:

$$H_{butter, order2}(f) = \frac{1}{\sqrt{1+\left(\frac{f}{fp}\right)^4}}. \tag{6}$$

A digital realization of a second order Butterworth filter can be obtained by implementing a biquadratic digital filter (biquad filter). In this context, a block diagram of a cascade of two identical biquad filters is given in FIG. 7.

After having chosen an appropriate fp, the filter coefficients b0, b1, b2, a1 and a2 can be obtained through a infinite impulse response filter design method such as bilinear transform.

In addition to this, it is especially assumed that two 200 MHz carriers, preferably new radio (NR) carriers, are exemplarily aggregated. The used physical resource blocks (PRBs) of the individual channels within the aggregated bandwidth are especially separated by the guard band.

For instance, let fs=245.76 MHz and $$fp = \frac{265}{256} * \frac{fs}{2}.$$

The resulting exemplary filter coefficients of a second order Butterworth filter are then given in the following tables:

TABLE 1

| Filter coefficients b | | |
| --- | --- | --- |
| b0 | b1 | b2 |
| 0.9913600344509876372 | 1.9827200689019752744 | 0.9913600344509876372 |

TABLE 2

| Filter coefficients a | |
|---|---|
| a1 | a2 |
| 1.9826454185041166856 | 0.98279471929983386325 |

Figure 8:
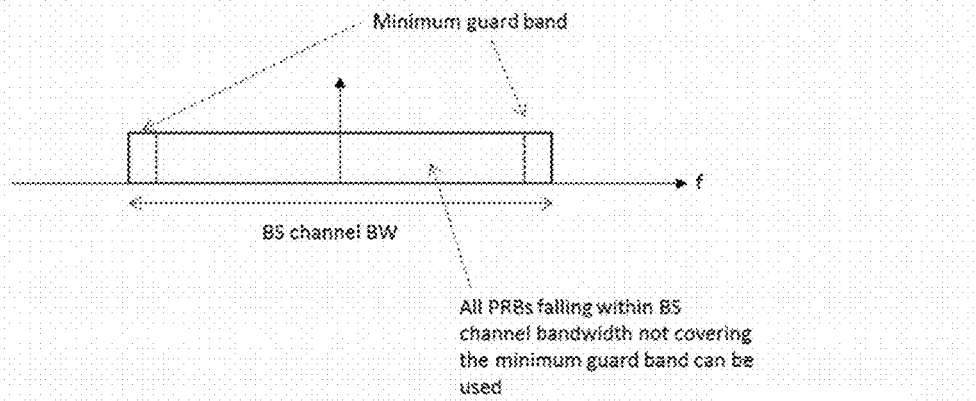
FIG. 8 shows an exemplary guard band definition.

Furthermore, in accordance with FIG. 8, the minimum guard band between the wanted signals of the two carriers is 2*4900 kHz=9.8 MHz. In this context, SCS denotes the sub carrier spacing, whereas (P)RBs denotes the (physical) resource blocks as already mentioned above. In addition to this, BS denotes the base station.

Figure 7:
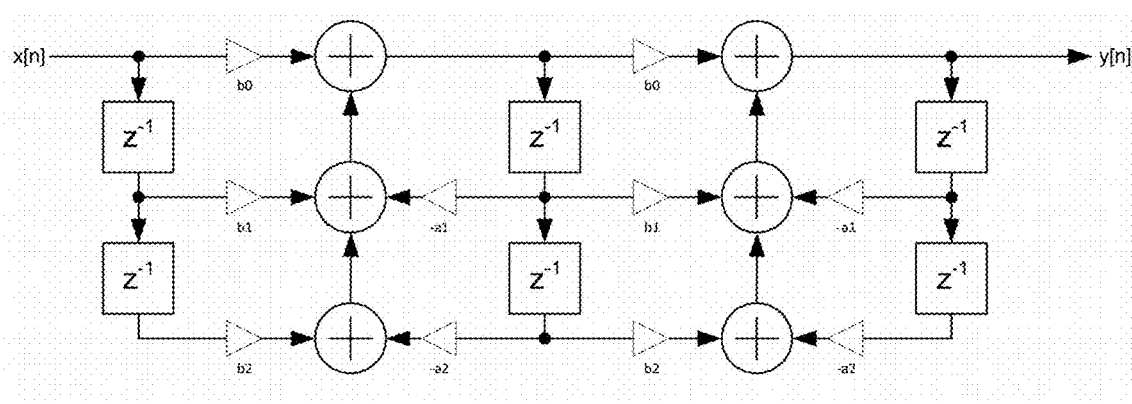
FIG. 7 shows an exemplary cascade of two identical biquad filters.
Figure 9:
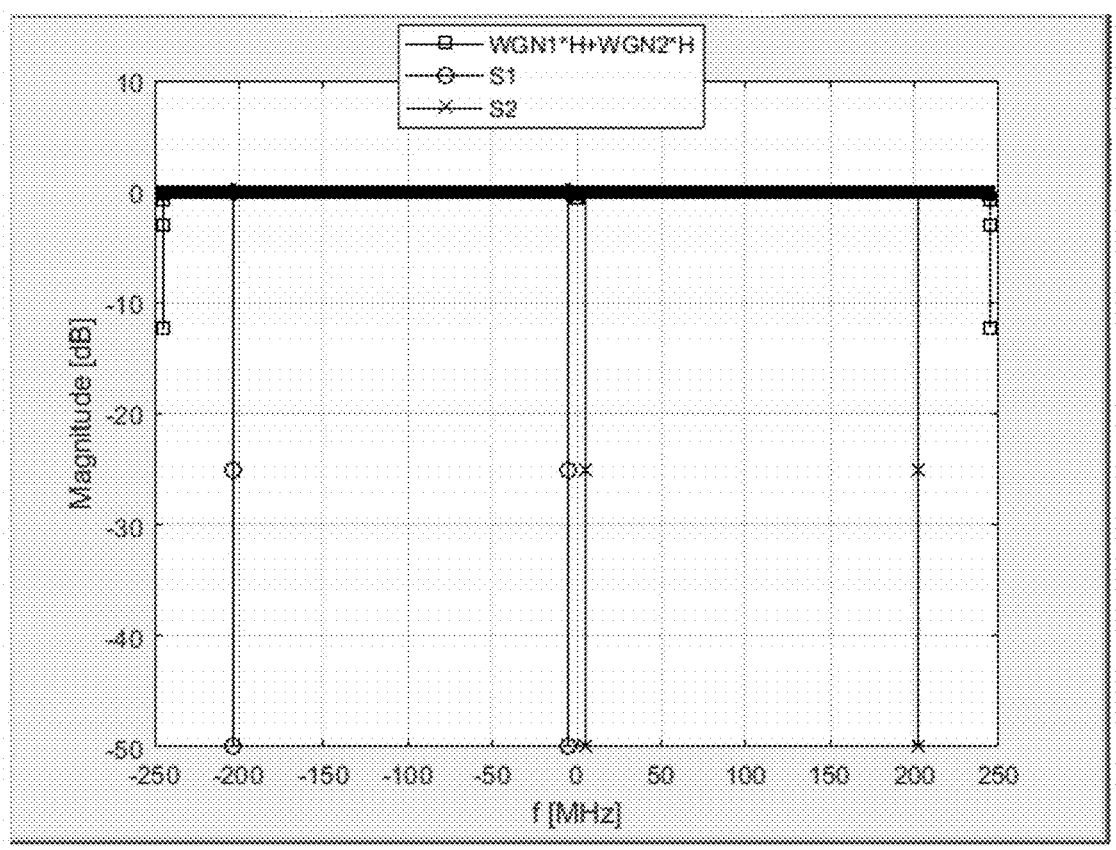
FIG. 9 shows a numerical example with respect to two signals with corresponding white gaussian noise.

Moreover, exemplarily assuming that both WGN1 and WGN2 are filtered with a lowpass filter H according to FIG. 7 and filter coefficients according to Table 1 and Table 2, then WGN1*H+WGN2*H, S1 and S2 are given in FIG. 9.

Figure 10:
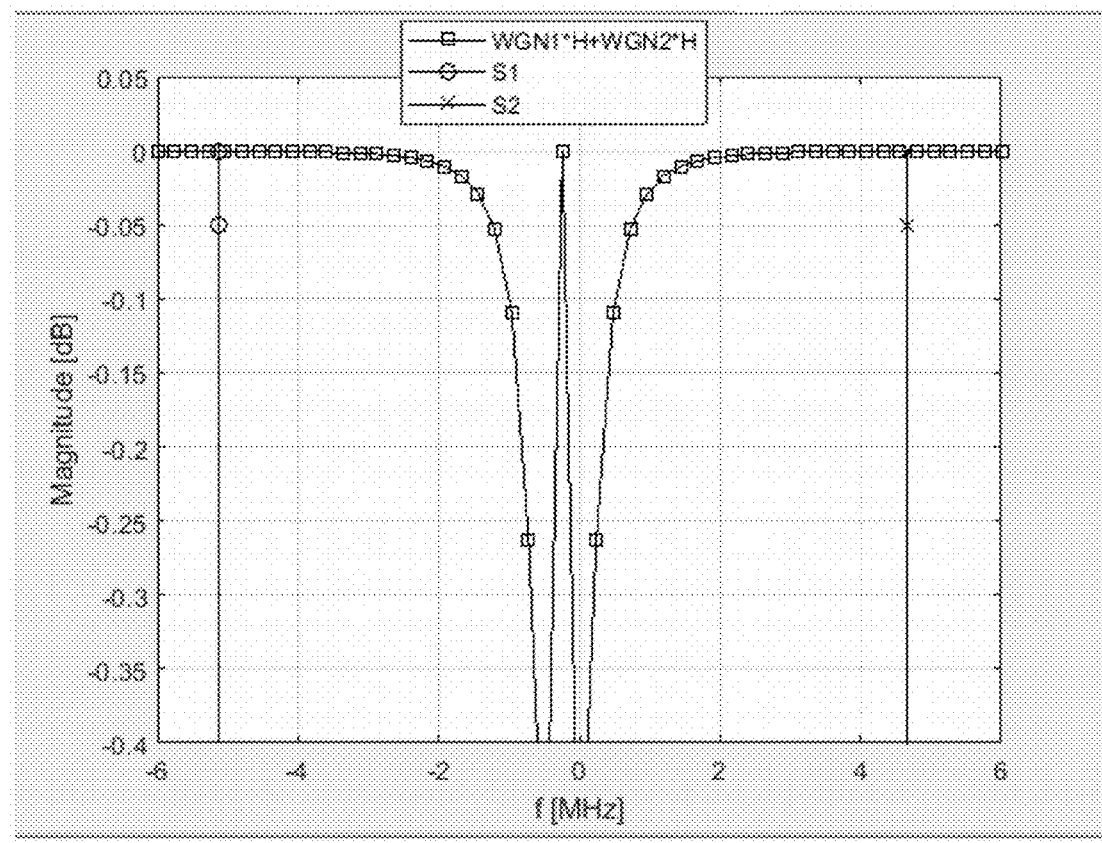
FIG. 10 shows an exemplary zoom into the guard band with respect to the numerical example.

In addition to this, an exemplary zoom into the guard band region is shown in FIG. 10.

With respect to the given example, one may find that the bandwidth region, wherein the ripple of WGN1*H+WGN2*H especially exceeds 0.05 dB, is approximately 2.5 MHz wide, while the guard band is at least 9.8 MHz wide. Thus, the ripple requirement within the wanted signal bandwidths can exemplarily be fulfilled.

Figure 11:
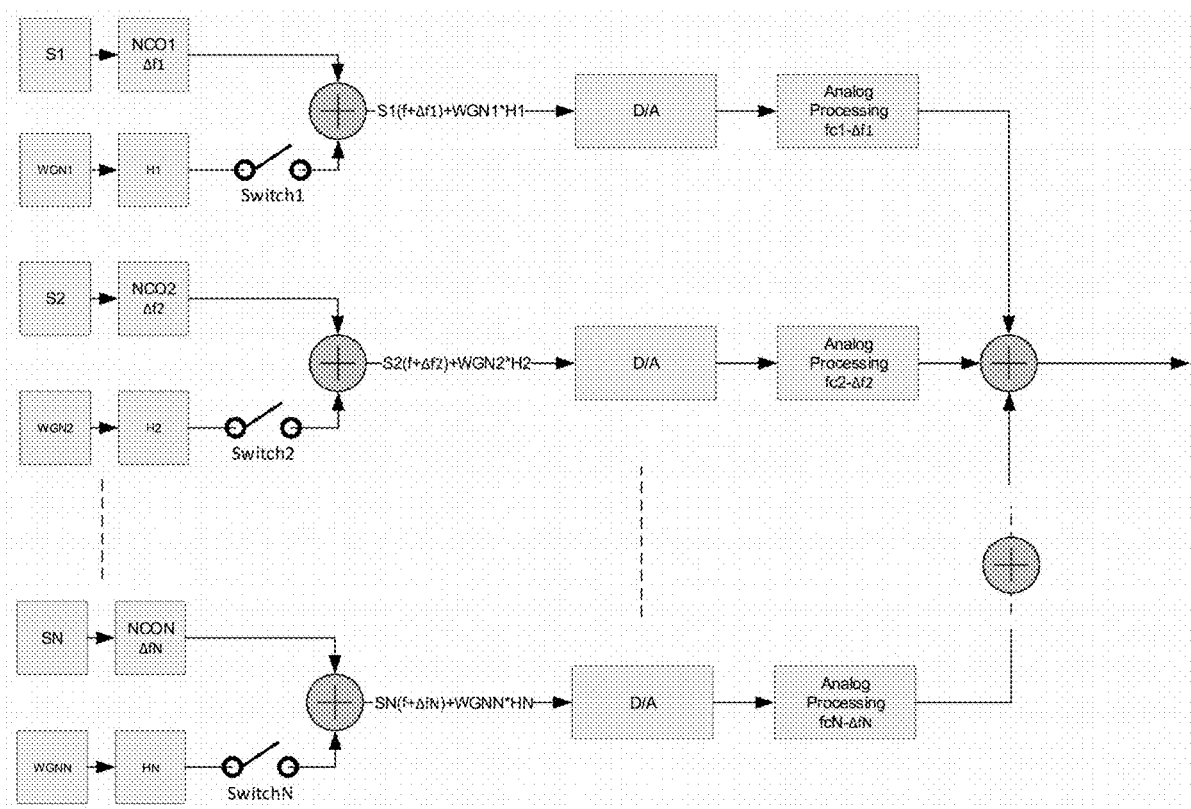
FIG. 11 shows a further exemplary embodiment of the inventive testing device.

Now, with respect to FIG. 11, a further exemplary embodiment of the inventive testing device is illustrated. In this context, we have N signals Si with $1<=i<=N$. Exemplarily, each signal Si can be shifted with $\Delta f_i$ wherein $\Delta f_i=0$ is especially not precluded. Moreover, it is noted that $Hi \neq Hj$ for $i \neq j$ is preferably not precluded.

Furthermore, it might be particularly advantageous if Hi does not necessarily have to be a lowpass filter. Any frequency response may preferably be possible (even a neutral one tap filter which will have no effect on the WGN signal at its input).

With respect to the i switches of FIG. 11, it is noted that each of said switches can either be closed (filtered WGN is added) or open (no filtered WGN is added).

It is further noted that with the aid of the structure depicted in FIG. 11, a noise signal with arbitrary bandwidth can especially be obtained after the analog addition. Advantageously, the only limitation may be the bandwidth of the analog system components.

Figure 12:
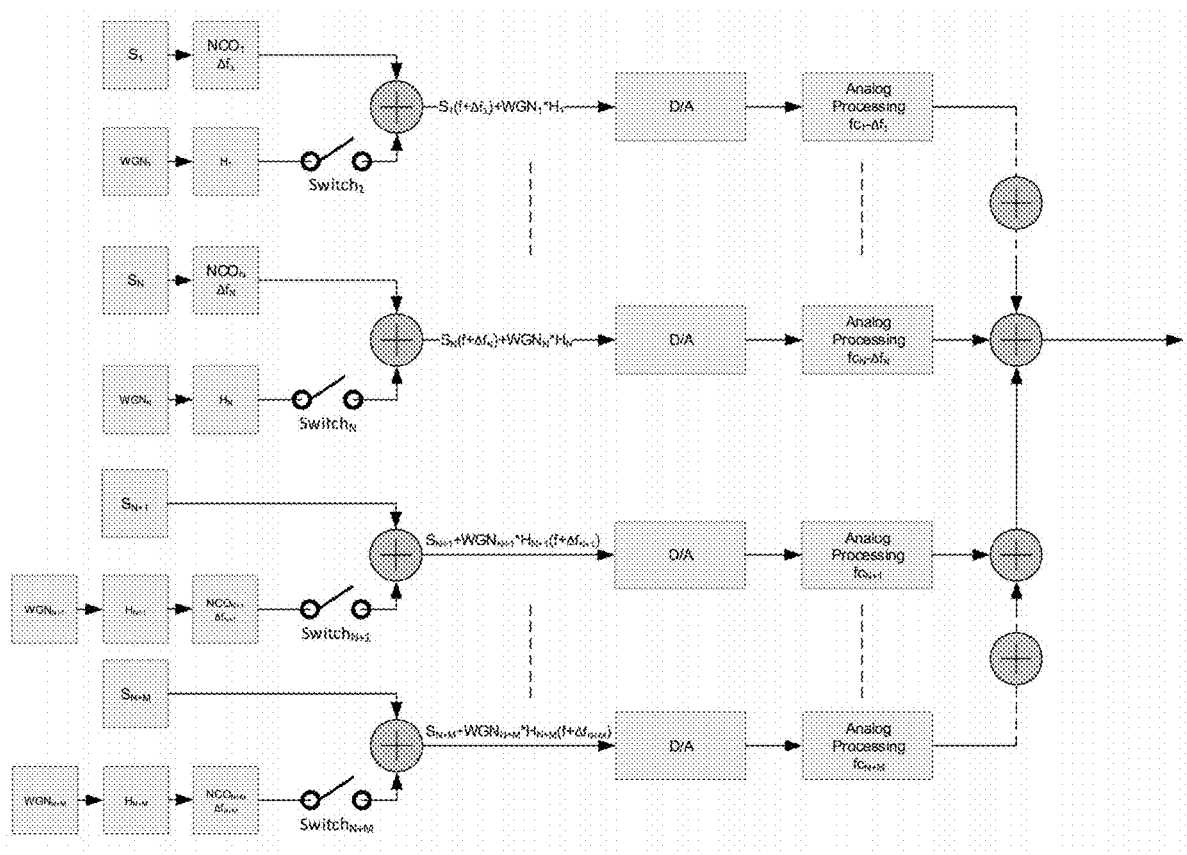
FIG. 12 shows a further exemplary embodiment of the first aspect of the invention.

As a further exemplary embodiment of the first aspect of the invention, in accordance with FIG. 12, the inventive testing device additionally comprises M signals, wherein the filtered WGN is especially shifted in frequency instead of S.

It is noted that especially in the case that the filtered WGN is shifted in frequency, no frequency compensation in the analog processing domain may preferably be required for the corresponding path.

With respect to both FIG. 11 and FIG. 12, it is noted that the Si units may preferably be equivalent to the signal generators according to FIG. 1. Furthermore, the WGNi units may preferably be equivalent to the white gaussian noise generators of FIG. 1. In addition to this, NCOi units may preferably be equivalent to the numerically controlled oscillators of FIG. 1.

Further additionally, the Hi units of FIG. 11 or FIG. 12, respectively, may preferably be equivalent to the digital filters according to the exemplary embodiment of FIG. 1. Moreover, the adders following the i switches may preferably be equivalent to the adders of FIG. 1. In further addition to this, the D/A units of FIG. 11 or FIG. 12, respectively, may preferably be equivalent to the digital-to-analog converters according to FIG. 1. Furthermore, the analog processing units and the following adders may preferably be equivalent to the analog processor of the first exemplary embodiment of the inventive testing device according to FIG. 1.

Optionally, a synchronization mechanism may preferably be added, which especially ensures that the frequency shifts in the analog domain and the frequency shifts in the digital domain occur simultaneously.

For instance, one way to achieve this would be a system time that is available and/or can be queried both in the digital processing units and in the units that control the analog processing. Advantageously, both analog and digital frequency shifts may preferably be performed at the same system time.

Figure 13A:
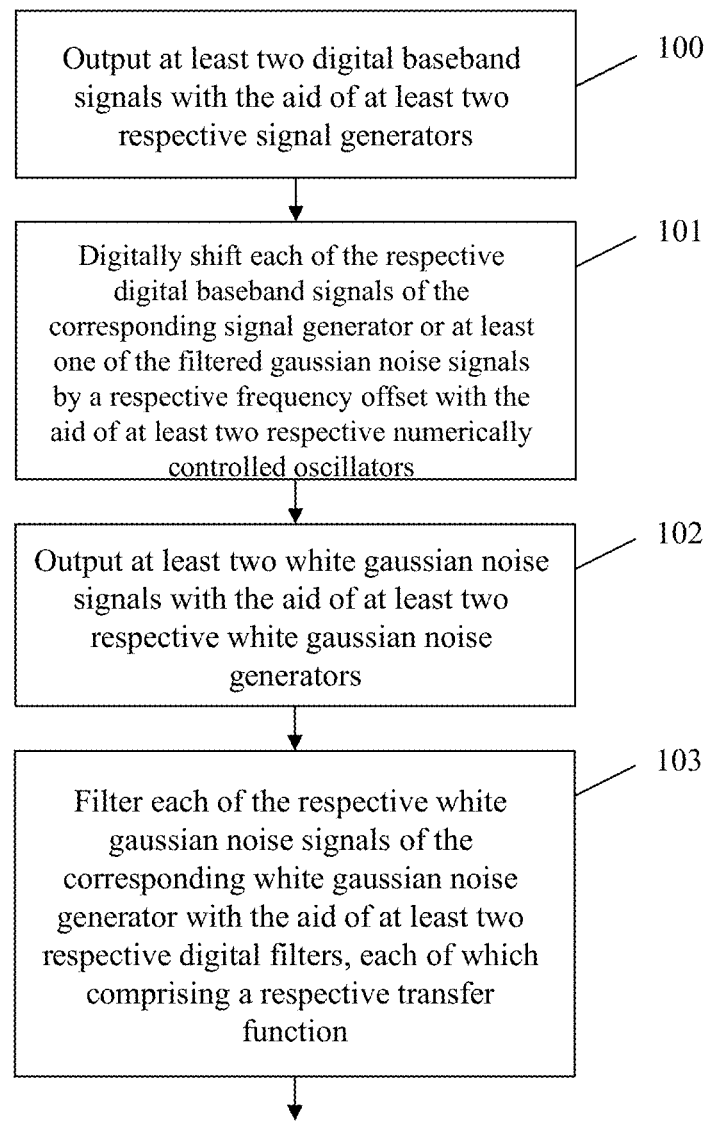
FIG. 13A shows a flow chart of an exemplary embodiment of the second aspect of the invention.
Figure 13B:
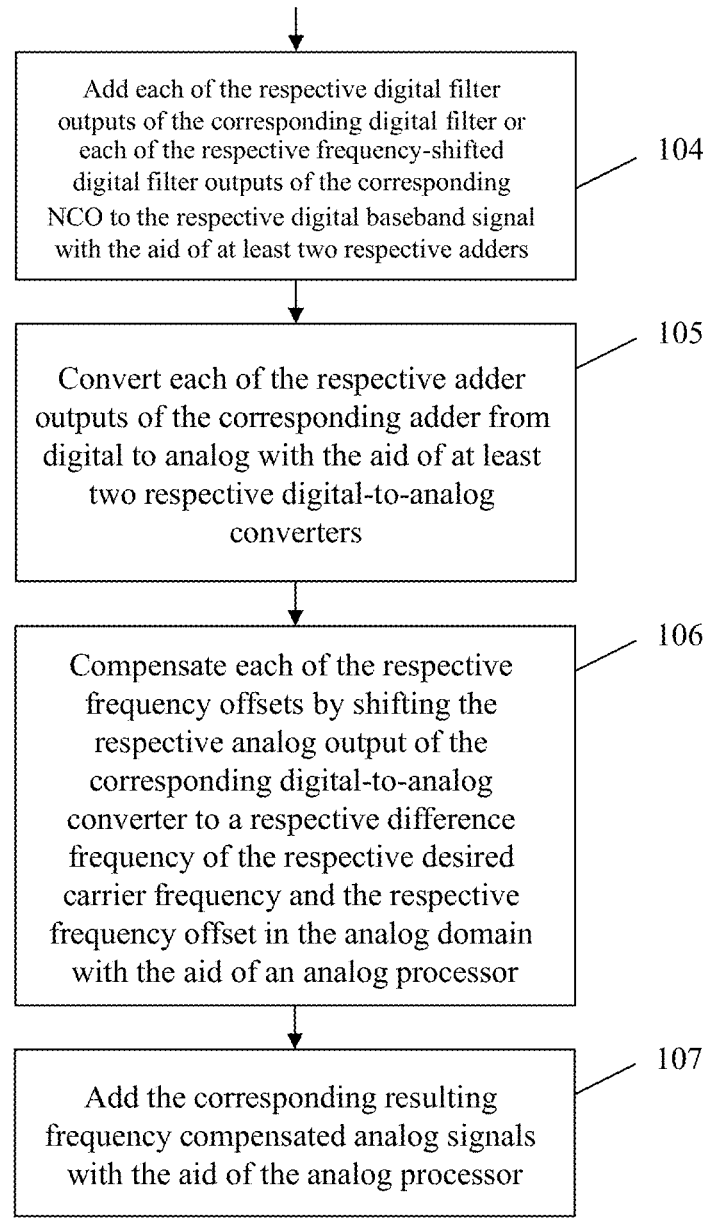
FIG. 13B shows the continuation of the flow chart of FIG. 13A.

Finally, FIGS. 13A and 13B show a flow chart of an exemplary embodiment of the inventive testing method for testing a device under test. In a first step 100, at least two digital baseband signals $s_i$ are outputted with the aid of at least two respective signal generators. Then, in a second step 101, each of the respective digital baseband signals $s_i$ of the corresponding signal generator is digitally shifted by a respective frequency offset $\Delta f_i$ with the aid of at least two respective numerically controlled oscillators. Furthermore, in a third step 102, at least two white gaussian noise signals $WGN_i$ are outputted with the aid of at least two respective white gaussian noise generators. Moreover, in a fourth step 103, each of the respective white gaussian noise signals $WGN_i$ of the corresponding white gaussian noise generator is filtered with the aid of at least two respective digital filters, each of which comprising a respective transfer function $H_i$.

In addition to this, in a fifth step 104, each of the respective digital filter outputs $WGN_i*H_i$ of the corresponding digital filter is added to the respective frequency-shifted digital baseband signal $s_i$, of the corresponding numerically controlled oscillator with the aid of at least two respective adders. Further additionally, in a sixth step 105, each of the respective adder outputs $s_i+WGN_i*H_i$ of the corresponding adder is converted from digital to analog with the aid of at least two respective digital-to-analog converters. Then, in a seventh step 106, each of the respective frequency offsets $\Delta f_i$ is compensated by shifting the respective analog output of the corresponding digital-to-analog converter to a respective difference frequency $f_{c,i}-\Delta f_i$ of the respective desired carrier frequency $f_{c,i}$ and the respective frequency offset $\Delta f_i$ in the analog domain with the aid of an analog processor. Furthermore, in an eighth step 107, the corresponding resulting frequency compensated analog signals are added with the aid of the analog processor.

In this context, it might be particularly advantageous if at least one frequency offset $\Delta f_i$ is not equal to zero. It is further noted that it might be particularly advantageous if the white gaussian noise signals $WGN_i$ are pairwise statistically independent.

Moreover, the testing method further may preferably comprise the step of designing the digital filters such that the overall noise frequency response after addition with the aid of the analog processor fulfills a minimum ripple requirement outside well-defined guard bands.

Furthermore, it is noted that at least two of the filtered white gaussian noise signals $WGN_i*H_i$ may especially overlap in the frequency domain after addition with the aid of the analog processor.

In addition to this or as an alternative, at least two of the filtered white gaussian noise signals $WGN_i*H_i$ may especially overlap in the frequency domain such that the at least two white gaussian noise signals fulfill a minimum ripple requirement outside well-defined guard bands.

With special respect to the minimum ripple requirement, it is noted that the minimum ripple requirement may especially be fulfilled by complementary edges of the at least two digital filters.

Moreover, the testing method may further comprise the step of designing the digital filters such that the following criteria are, preferably approximately, fulfilled:

$$|H_i(f_{p,i}+\Delta_i)|^2+|H_i(f_{p,i}-\Delta_i)|^2=1$$

and $$|H_i(-f_{p,i}+\Delta_i)|^2+|H_i(-f_{p,i}-\Delta_i)|^2=1,$$

wherein $f_{p,i}$ denotes the frequency at the respective 3-dB point,
wherein $|\Delta_i| \leq \min(fs/2-f_{p,i}, f_{p,i})$,
wherein $f_s$ denotes the sampling frequency.

In addition to this or as an alternative, the testing method further comprises the step of designing the digital filters such that the following criteria are fulfilled:

$$1-e_i \leq |H_i(f_{p,i}+\Delta_i)|^2+|H_i(f_{p,i}-\Delta_i)|^2 \leq 1+e_i \text{ and}$$

$$1-e_i \leq |H_i(-f_{p,i}+\Delta_i)|^2+|H_i(-f_{p,i}-\Delta_i)|^2 \leq 1+e_i,$$

wherein denotes $e_i$ a respective allowed ripple,
wherein $f_{p,i}$ denotes the frequency at the respective 3-dB point,
wherein $|\Delta_i| \leq \min(fs/2-f_{p,i}, f_{p,i})$,
wherein $f_s$ denotes the sampling frequency.

It might be particularly advantageous if the at least one of the at least two digital filters comprises or is a Butterworth filter.

In addition to this or as an alternative, at least one of the at least two digital filters comprises or is an elliptic filter.

Further additionally or further alternatively, it is noted that at least one transfer function $H_i$ is of trapezoidal shape.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A testing device for testing a wireless communication device under test, the testing device comprising:
   at least two signal generators,
   at least two numerically controlled oscillators,
   at least two white gaussian noise generators,
   at least two digital filters, each of which comprising a respective transfer function $H_i$,
   at least two adders,
   at least two digital-to-analog converters, and
   an analog processor,
   wherein each of the at least two signal generators is configured to output a respective digital baseband signal $s_i$,
   wherein each of the at least two white gaussian noise generators is configured to output a respective white gaussian noise signal $WGN_i$,
   wherein each of the at least two digital filters is configured to filter the respective white gaussian noise signal $WGN_i$ of the corresponding white gaussian noise generator,
   wherein at least one of the at least two numerically controlled oscillators is configured to digitally shift the respective digital baseband signal $s_i$ of the corresponding signal generator by a respective frequency offset $\Delta f_i$,
   wherein at least one of the at least two numerically controlled oscillators is configured to digitally shift the respective filtered white gaussian noise signal $WGN_i*H_i$ of the corresponding digital filter by a respective frequency offset $\Delta f_i$,
   wherein at least one of the at least two adders is configured to add the respective digital filter output $WGN_i*H_i$ of the corresponding digital filter to the respective frequency-shifted digital baseband signal $s_i$ of the corresponding numerically controlled oscillator, and
   wherein the digital filters are designed such that an overall noise frequency response, in accordance with a wireless communication standard, after addition with the aid of the analog processor fulfills a minimum ripple requirement outside a defined guard band by which the respective digital baseband signals are separated.

2. The testing device according to claim 1,
   wherein at least one of the at least two adders is configured to add the respective frequency-shifted digital filter output $(WGN_i*H_i)$, of the corresponding numerically controlled oscillator to the respective digital baseband signal $s_i$ of the corresponding signal generator,
   wherein each of the at least two digital-to-analog converters is configured to convert the respective adder output $s_i+WGN_i*H_i$ or $s_i+(WGN_i*H_i)$ of the corresponding adder from digital to analog,
   wherein in the case that the respective digital baseband signal $s_i$ of the corresponding signal generator has digitally been shifted in frequency, the analog processor is configured to compensate the respective frequency offset $\Delta f_i$ by shifting the respective analog output of the corresponding digital-to-analog converter to a respective difference frequency $f_{c,i}-\Delta f_i$ of the respective desired carrier frequency $f_{c,i}$ and the respective frequency offset $\Delta f_i$ in the analog domain, and
   wherein the analog processor is configured to add the corresponding resulting frequency compensated analog signals.

3. The testing device according to claim 1, wherein at least one frequency offset $\Delta f_i$ is not equal to zero.

4. The testing device according to claim 2, wherein the white gaussian noise signals $WGN_i$ are pairwise statistically independent.

5. The testing device according to claim 2, wherein at least two of the filtered white gaussian noise signals $WGN_i*H_i$ or $(WGN_i*H_i)$ overlap in the frequency domain after addition with the aid of the analog processor.

6. The testing device according to claim 2, wherein at least two of the filtered white gaussian noise signals $WGN_i*H_i$ or $(WGN_i*H_i)$ overlap in the frequency domain such that the at least two white gaussian noise signals fulfill a minimum ripple requirement outside a defined guard band by which the respective digital baseband signals are separated.

7. The testing device according to claim 4, wherein the minimum ripple requirement is fulfilled by complementary edges of the at least two digital filters.

8. The testing device according to claim 1, wherein the digital filters are designed such that the following criteria are, preferably approximately, fulfilled:

$$|H_i(f_{p,i}+\Delta_i)|^2+|H_i(f_{p,i}-\Delta_i)|^2=1$$

and $$|H_i(-f_{p,i}+\Delta_i)|^2+|H_i(-f_{p,i}-\Delta_i)|^2=1,$$

wherein $f_{p,i}$ denotes the frequency at the respective 3-dB point,
wherein $|\Delta_i| \leq \min(f_s/2-f_{p,i}, f_{p,i})$,
wherein $f_s$ denotes the sampling frequency.

9. The testing device according to claim 1, wherein the digital filters are designed such that the following criteria are fulfilled:

$$1-e_i \leq |H_i(f_{p,i}+\Delta_i)|^2+|H_i(f_{p,i}-\Delta_i)|^2 \leq 1+e_i$$

and $$1-e_i \leq |H_i(-f_{p,i}+\Delta_i)|^2+|H_i(-f_{p,i}-\Delta_i)|^2 \leq 1+e_i,$$

wherein $e_i$ denotes a respective allowed ripple,
wherein $f_{p,i}$ denotes the frequency at the respective 3-dB point,
wherein $|\Delta_i| \leq \min(f_s/2-f_{p,i}, f_{p,i})$,
wherein $f_s$ denotes the sampling frequency.

10. The testing device according to claim 1,
wherein at least one of the at least two digital filters comprises or is a Butterworth filter or
wherein at least one of the at least two digital filters comprises or is an elliptic filter or
wherein at least one transfer function $H_i$ is of trapezoidal shape.

11. A testing method for testing a wireless communication device under test, the testing method comprising the steps of:
outputting at least two digital baseband signals $s_i$ with the aid of at least two respective signal generators,
outputting at least two white gaussian noise signals $WGN_i$ with the aid of at least two respective white gaussian noise generators,
filtering each of the respective white gaussian noise signals $WGN_i$ of the corresponding white gaussian noise generator with the aid of at least two respective digital filters, each of which comprising a respective transfer function $H_i$
digitally shifting at least one of the respective digital baseband signals $s_i$ of the corresponding signal generator by a respective frequency offset $\Delta f_i$ with the aid of at least one of at least two respective numerically controlled oscillators,
digitally shifting at least one of the respective filtered white gaussian noise signals $WGN_i*H_i$ of the corresponding digital filter by a respective frequency offset $\Delta f_i$ with the aid of at least one of at least two respective numerically controlled oscillators, and
adding at least one of the respective digital filter outputs $WGN_i*H_i$ of the corresponding digital filter to the respective frequency-shifted digital baseband signal $s_i$ of the corresponding numerically controlled oscillator with the aid of at least one of at least two respective adders,
wherein the digital filters are designed such that an overall noise frequency response, in accordance with a wireless communication standard, after addition with the aid of the analog processor fulfills a minimum ripple requirement outside a defined guard band by which the respective digital baseband signals are separated.

12. The testing method according to claim 11, further comprising the steps of:
adding at least one of the respective frequency-shifted digital filter outputs $(WGN_i*H_i)$, of the corresponding numerically controlled oscillator to the respective digital baseband signal $s_i$ of the corresponding signal generator with the aid of at least one of at least two respective adders,
converting each of the respective adder outputs $s_i+WGN_i*H_i$ or $s_i+(WGN_i*H_i)$ of the corresponding adder from digital to analog with the aid of at least two respective digital-to-analog converters,
in the case that the respective digital baseband signal $s_i$ of the corresponding signal generator has been digitally shifted in frequency, compensating each of the respective frequency offsets $\Delta f_i$ by shifting the respective analog output of the corresponding digital-to-analog converter to a respective difference frequency $f_{c,i}-\Delta f_i$ of the respective desired carrier frequency $f_{c,i}$ and the respective frequency offset $\Delta f_i$ in the analog domain with the aid of an analog processor, and
adding the corresponding resulting frequency compensated analog signals with the aid of the analog processor.

13. The testing method according to claim 12, wherein at least one frequency offset $\Delta f_i$ is not equal to zero.

14. The testing method according to claim 12, wherein the white gaussian noise signals $WGN_i$ are pairwise statistically independent.

15. The testing method according to claim 12,
wherein at least two of the filtered white gaussian noise signals $WGN_i$ $H_i$ or $(WGN_i*H_i)$ overlap in the frequency domain after addition with the aid of the analog processor, or
wherein at least two of the filtered white gaussian noise signals $WGN_i*H_i$ or $(WGN_i*H_i)$ overlap in the frequency domain such that the at least two white gaussian noise signals fulfill a minimum ripple requirement outside a defined guard band by which the respective digital baseband signals are separated.

16. The testing method according to claim 14, wherein the minimum ripple requirement is fulfilled by complementary edges of the at least two digital filters.

17. The testing method according to claim 12, wherein the testing method further comprises the step of designing the digital filters such that the following criteria are, preferably approximately, fulfilled:

$$|H_i(f_{p,i}+\Delta_i)|^2+|H_i(f_{p,i}-\Delta_i)|^2=1$$

and $$|H_i(-f_{p,i}+\Delta_i)|^2+|H_i(-f_{p,i}-\Delta_i)|^2=1,$$

wherein $f_{p,i}$ denotes the frequency at the respective 3-dB point,
wherein $|\Delta_i| \leq \min(f_s/2-f_{p,i}, f_{p,i})$,
wherein $f_s$ denotes the sampling frequency, or wherein the testing method further comprises the step of designing the digital filters such that the following criteria are fulfilled:

$$1-e_i \leq |H_i(f_{p,i}+\Delta_i)|^2 + |H_i(f_{p,i}-\Delta_i)|^2 \leq 1+e_i$$

and $$1-e_i \leq |H_i(-f_{p,i}+\Delta_i)|^2 + |H_i(-f_{p,i}-\Delta_i)|^2 \leq 1+e_i,$$

wherein $e_i$ denotes a respective allowed ripple,
wherein $f_{p,i}$ denotes the frequency at the respective 3-dB point,
wherein $|\Delta_i| \leq \min(fs/2 - f_{p,i}, f_{p,i})$,
wherein $f_s$ denotes the sampling frequency.

18. The testing method according to claim 12,
wherein at least one of the at least two digital filters comprises or is a Butterworth filter, or
wherein at least one of the at least two digital filters comprises or is an elliptic filter, or
wherein at least one transfer function $H_i$ is of trapezoidal shape.

19. The testing device of claim 1, wherein the testing device is configured to provide a defined signal-to-noise (SNR) within an aggregated bandwidth.

* * * * *